(12) United States Patent
Horch et al.

(10) Patent No.: US 6,686,612 B1
(45) Date of Patent: Feb. 3, 2004

(54) THYRISTOR-BASED DEVICE ADAPTED TO INHIBIT PARASITIC CURRENT

(75) Inventors: Andrew Horch, Sunnyvale, CA (US); Scott Robins, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/263,382

(22) Filed: Oct. 1, 2002

(51) Int. Cl.$^7$ ............................................. H01L 29/423
(52) U.S. Cl. ...................................... 257/133; 257/146
(58) Field of Search ................................ 257/133, 146

(56) References Cited

U.S. PATENT DOCUMENTS

| | | |
|---|---|---|
| 4,462,151 A | 7/1984 | Geipel, Jr. et al. |
| 4,555,842 A | 12/1985 | Levinstein et al. |
| 5,179,038 A | 1/1993 | Kinney et al. |
| 5,357,125 A * | 10/1994 | Kumagi ....................... 257/133 |
| 5,770,490 A | 6/1998 | Frenette et al. |
| 5,882,965 A | 3/1999 | Schwalke et al. |
| 5,932,919 A | 8/1999 | Schwalke et al. |
| 6,028,339 A | 2/2000 | Frenette et al. |
| 6,104,045 A | 8/2000 | Forbes et al. |
| 6,225,165 B1 | 5/2001 | Noble, Jr. et al. |
| 6,229,161 B1 | 5/2001 | Nemati et al. |

OTHER PUBLICATIONS

2001, K. DeMeyer, S. Kubicek and H. van Meer, *Raised Source/Drains with Disposable Spacers for sub 100 nm CMOS technologies*, Extended Abstracts of International Workshop on Junction Technology.

Mar. 1991, Mark Rodder and D. Yeakley, *Raised Source/Drain MOSFET with Dual Sidewall Spacers*, IEEE Electron Device Letters, vol. 12, No. 3.

Sep. 2001, Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9.

Oct. 1, 2001, N. Lindert, Y.–K. Choi, L. Chang, E. Anderson, W.–C. Lee, T.–J. King, J. Bokor, and C. Hu, *Quasi–Planar FinFETs with Selectively Grown Germanium Raised Source/Drain*, 2001 IEEE International SOI Conference.

1998, T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

(List continued on next page.)

*Primary Examiner*—Ngân V. Ngô

(57) ABSTRACT

Parasitic current leakage from a thyristor-based semiconductor device is inhibited. According to an example embodiment of the present invention, a thyristor-based semiconductor device includes a thyristor body portion and a control port located in a substrate, the control port being adapted for capacitively coupling to the thyristor body portion for controlling current flow therein. The substrate further includes a doped circuit region separated by a channel region from another doped region of similar polarity in the substrate. The control port faces the channel region in the substrate, and the channel region is susceptible to current leakage in response to voltage pulses being applied to the control port for controlling current flow in the thyristor. The device is arranged such that such current leakage in the channel is inhibited while pulses are applied to the control port for controlling current flow in the thyristor; the parasitic current leakage between the doped circuit region and the doped region in the substrate is inhibited.

30 Claims, 5 Drawing Sheets

OTHER PUBLICATIONS

Aug. 2001, Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain*, IEEE Transactions on Electron Devices, vol. 48, No. 8, Aug. 2001.

1986, Stanley Wolf Ph.D. and Richard N. Tauber Ph.D., *Silicon Processing for The VLSI Era*, vol. 1, 1986, pp. 285–286.

1985, S.M. Sze, *Physics of Semiconductor Devices*, A Wiley–Interscience Publication, Second Edition, 1981, pp. 397 and 442.

Apr. 2000, Ponomarev, Y.V., Stolk, P.A., Salm, C., Schmitz, J., and Woerlee, P.H., *High–Performance Deep SiubMicron CMOS Technologies with Polycrystalline–SeGe Gates*, IEEE Transactions on Electron Devices, vol. 47, No. 4, pp. 848–855.

Jul. 2000, Ponomarev et al., *A 0.13 µm Poly–SiGe Gate CMOS Technology for Low–Voltage Mixed–Signal Applications*, IEEE Transactions on Electron Devices, vol. 47, No. 7, pp. 1507–1513.

Jul. 1997, Ponomarev, Y.V., Schmitz, J., Woerlee, P.H., Stolk, P.A., and Gravesteijn, D.J., *Gate–Workfunction Engineering Using Poly–(Se,Ge) for High–Performance 0.18 µm CMOS Technology*, IEDM Tech. Dig., pp. 829–832.

* cited by examiner

THYRISTOR-BASED DEVICE ADAPTED TO INHIBIT PARASITIC CURRENT

RELATED PATENT DOCUMENTS

This document is related to U.S. patent application Ser. No. 10/262,787 (TRAM.011PA), entitled "Thyristor-based Device that Inhibits Undesirable Conductive Channel Formation," and to U.S. patent application Ser. No. 10/262,729 (TRAM.014PA), entitled "Trench Isolation for Thyristor-based Device," both of which are filed concurrently herewith and fully incorporated herein by reference.

FIELD OF THE INVENTION

The present invention is directed to semiconductor devices and, more specifically, to thyristor-based semiconductor devices, such as thyristor-based memory devices and other thyristor-based current-switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively coupled thyristor-type devices and memory implementations, includes forming devices in a very dense array. In order to achieve such a dense array, it is sometimes desirable to form trenches having a very high aspect ratio (the ratio of height to width of the opening of the trench). Portions of the devices must be electrically insulated from other circuitry, however, and commonly used insulative materials are difficult to implement when filling trenches having high aspect ratios (e.g., greater than 2:1).

Another important consideration in semiconductor device design, including designs employing thin capacitively-coupled thyristor-type devices, includes the inhibition of parasitic current leakage from the device. Such leakage may occur, for example, between portions of the thyristor and adjacent circuitry (e.g., doped substrate) in the semiconductor device. In particular, thyristor devices coupled in series with adjacent pass devices are susceptible to parasitic MOSFET current passing between portions of the thyristor and the pass device and/or between portions of the pass device and other circuitry. For example, parasitic current can pass between a source/drain region of the pass device and an emitter region of the thyristor via a well region in the substrate of the semiconductor device. The parasitic current passes when a voltage pulse applied to the control port of the thyristor for switching the thyristor between conductance states also undesirably switches the well region into a conducting state. The parasitic current affects the operation of the device and can cause operational errors that may alter the performance of devices in which the thin capacitively-coupled thyristor device is used.

These and other design considerations have presented challenges to efforts to implement such a thin capacitively-coupled thyristor in bulk substrate applications, and in particular to applications susceptible to parasitic current.

SUMMARY

The present invention is directed to overcoming the above-mentioned challenges and others related to the types of devices and applications discussed above and in other memory cells. The present invention is exemplified in a number of implementations and applications, some of which are summarized below.

According to an example embodiment of the present invention, a semiconductor device includes a thyristor having portions adjacent to doped regions of a substrate that are susceptible to passing leakage current therebetween in response to the operation of the thyristor. The substrate includes first and second doped portions doped to the same polarity and separated by a channel region. The thyristor includes a control port and a body having a region in the substrate, the channel region being susceptible to leakage current between the two doped regions in response to a voltage pulse being applied to the control port for controlling current flow in the thyristor body region in the substrate. The voltage pulse is used, for example, for switching the thyristor between current-passing and current blocking states (e.g., causing of an outflow of minority carriers in the thyristor body via the coupling of voltage pulses for switching the thyristor into a blocking state). The thyristor body, the control port and the first and second doped portions are arranged for inhibiting parasitic current leakage between the first and second doped portions via the channel region when the voltage pulse is applied to the control port. With this approach, control of the state of the thyristor can be achieved while addressing difficulties associated with the formation of a conductive channel in adjacent portions of the substrate, such as those discussed above.

According to another example embodiment of the present invention, a semiconductor device includes a thyristor that exhibits inhibited parasitic leakage current. The semiconductor device includes a substrate having first and second adjacent substrate regions of opposite doping, a thyristor and a current pass device. The thyristor includes a control port adapted for capacitively coupling to a thyristor body and adapted to control current in the thyristor body, where at least one region of the thyristor body is contiguously adjacent to the second doped substrate region. A first side of the control port faces the thyristor body and a second side of the control port faces the first doped substrate region. The current pass device is coupled in series with the thyristor body and includes a doped portion adjacent to the control port and immediately adjacent to the first doped substrate region. The second doped substrate region is adjacent to the control port, immediately adjacent to the first doped region and is doped with the same polarity as the doped portion. The thyristor body, the control port and the current pass device are configured and arranged to inhibit parasitic current leakage from the thyristor, including leakage that can occur through the second doped substrate region from the thyristor body region contiguously adjacent to the second doped substrate region.

In another more particular example embodiment of the present invention, the semiconductor device includes a lined trench that includes at least a portion of the control port. The lined trench includes a lining material on the sides of the control port, and the control port is adapted for capacitively coupling to the thyristor body via the lining material. A portion of the lining material between the control port and the first doped substrate region is relatively thicker than a portion of the lining material between the control port and the thyristor body. The relatively thicker liner material is adapted to inhibit the control port from forming a conductive channel in the first doped substrate region between the doped portion of the pass device and the second doped substrate region.

In another example embodiment of the present invention, a memory array includes at least one memory cell having a thyristor-based device adapted to exhibit inhibited parasitic current leakage, such as the thyristor-based devices described above. A thyristor is coupled in series with a pass device, wherein a gate of the pass device is part of a first word line and a control port of the thyristor is part of a second word line. The thyristor includes a body having first and second end portions, each end portion having a base region electrically coupled to an emitter region, the end portions being electrically coupled at the base regions. A control port including a portion of the second word line is adapted for capacitively coupling to the base region at the first end portion. The pass device includes first and second source/drain regions separated by a channel in the first doped substrate region, the gate being over the channel. The first source/drain region of the pass device is electrically coupled to the first emitter region of the thyristor and the second source/drain region of the pass device is electrically coupled to a bit line. The second emitter of the thyristor is electrically coupled to a voltage line (e.g., for holding the second emitter at a reference voltage). The pass device is adapted to switch between a current blocking state and a conducting state in response to a voltage being applied to the first word line. Similarly, the thyristor is adapted to switch between a current blocking state and a conducting state in response to at least one voltage pulse being applied to the second word line. Data is stored as the state of the thyristor, with access to the stored state being via the pass device. The memory cell is configured and arranged to inhibit the formation of a conductive channel (e.g., in response to the second word line voltage) between the first source/drain region and the second emitter region via the first and second doped regions.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1A:
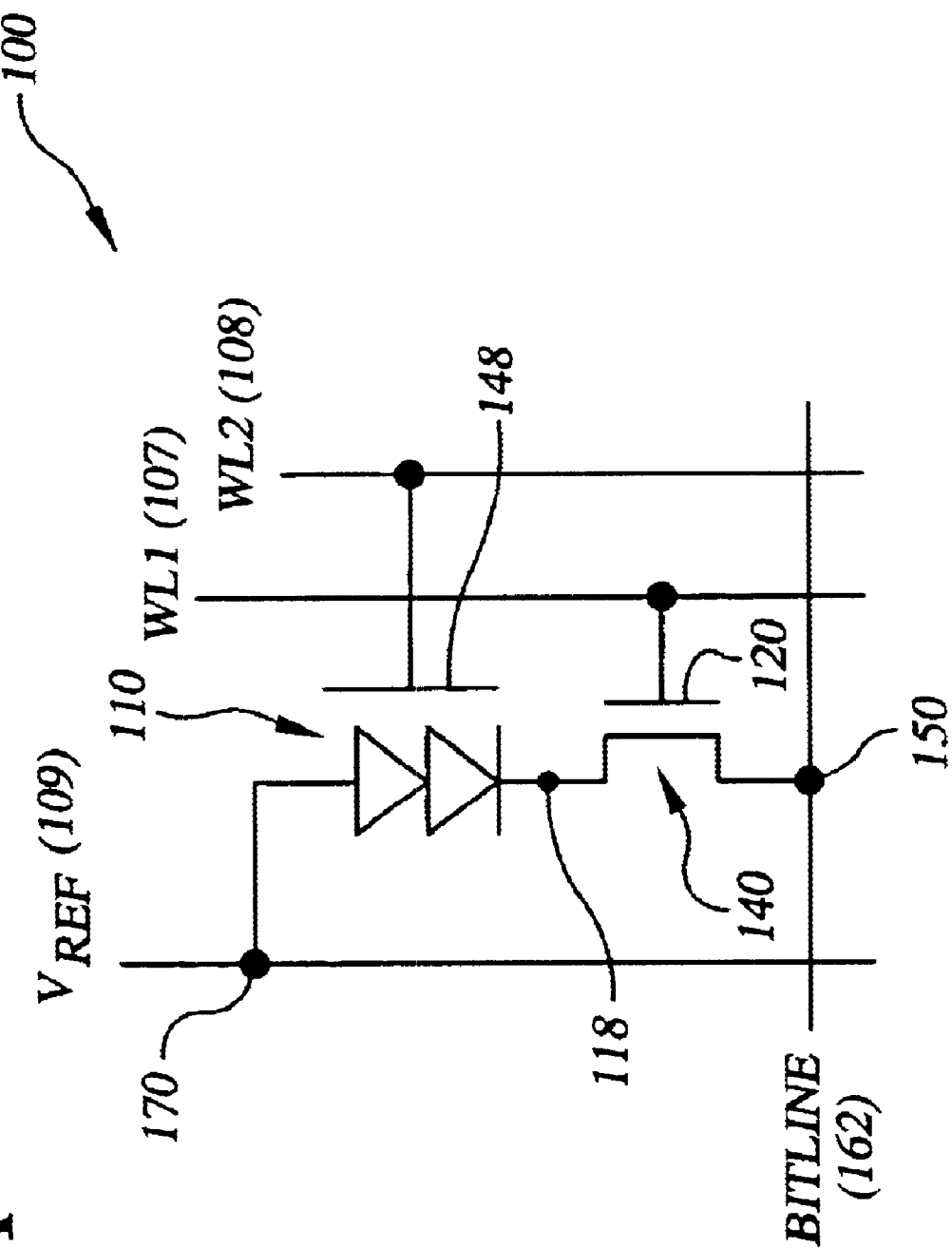
FIG. 1A is a circuit including a thyristor-based device having an anode contact with a varied width, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of applications, and has been found to be particularly useful for thyristor-based applications, such as those employing memory cells. While the present invention is not necessarily limited to such applications, various aspects of the invention may be appreciated through a discussion of various examples using this context.

According to an example embodiment of the present invention, a thyristor-based (i.e., thyristor-including) semiconductor device is configured and arranged to inhibit parasitic current leakage. The thyristor-based device includes first and second doped substrate regions of opposite polarity in which portions of a thyristor and of a pass device are formed. The thyristor includes at least two end portions, each end portion having a base region electrically coupled to an emitter region, where the base regions are electrically coupled to one another. A control port is adapted for capacitively coupling to one of the base regions for controlling current in the thyristor and includes a surface portion facing the first doped substrate region and adjacent to the second doped substrate region. The thyristor current control, for example, may include causing an outflow of minority carriers in the base region to which the control port is capacitively coupling for switching the thyristor between a current-passing state and a current-blocking state. A current pass device is coupled in series with the thyristor at one of the emitter regions and arranged such that a doped portion of the pass device is adjacent to the control port and to the first doped substrate region, the doped portion being doped to the same polarity as the second doped substrate region. The device is configured and arranged to inhibit parasitic current leakage from the doped portion of the pass device, which is adjacent to the control port, to the second doped substrate region.

In a more particular example embodiment, the thyristor body and control port are configured and arranged to inhibit a significant level of current leakage between the doped portion of the pass device and the second doped substrate region. Significant levels of such parasitic leakage could result in undesired conditions such as a latch-up, disturbances to the operational voltages of one both of the first and second doped substrate regions, related interference with the write operation of a memory cell using such a thyristor construction, and/or intolerable/undesired MOS-channel inversion in the channel region between the first and second doped substrate regions. In various example embodiments of the present invention (e.g., to achieve a high density circuit arrangement), the channel region between the first and second doped substrate regions is sufficiently close to the thyristor control port that such channel inversion can occur due to voltage pulses being capacitively coupled to the adjacent substrate region. For more information regarding such a channel inversion, reference may be made to Sze, "Semiconductor Devices—Physics and Technology," $2^{nd}$ Edition, John Wiley & Sons, Inc., 2002, which is fully incorporated herein by reference.

In one implementation, the control port is in a trench lined with an insulative material adapted to inhibit this undesired leakage. In another implementation, the control port is arranged to underlap portions of the body.

In each of these implementations, control over the conductance state of the thyristor is effected without causing these significant levels of leakage in this channel region which is adjacent to the control port. For general information regarding thyristor-based devices and for specific information regarding the inhibition of conductive channel formation that may be applicable for use in connection with one or more example embodiments of the present invention, reference may be made to the above-referenced patent document entitled "Thyristor-based Device that Inhibits Undesirable Conductive Channel Formation" (TRAM.011PA).

As discussed above, the present invention is applicable to a variety of devices and circuit arrangements. FIG. 1A shows one such circuit arrangement 100, according to a particular example embodiment of the present invention. The circuit arrangement 100 includes a thyristor body 110 and a pass device 140 (e.g., a transistor) electrically coupled in series. Control ports 120 and 148 are adapted to control current flow in the thyristor body 110 and the pass device 140, respectively, in response to signals applied to first (WL1) and second (WL2) word lines 107 and 108. A contact 170 is adapted for electrically coupling a signal from a reference voltage (Vref) line 109 to a buried emitter region of the thyristor body region 110. In addition, a bit line contact 150 is adapted for electrically coupling a signal from a bit line 162 to a source/drain region of the pass device 140. In response to signals applied to WL1 and WL2, and using signals at the bit line 162 and Vref line 109, the device 100 is adapted for writing data to and/or reading data from the device 100 (e.g., node 118). The thyristor body and control port are further configured and arranged to inhibit an undesired level, in some applications no level, of current leakage between the pass device and the second doped substrate region.

The signals (e.g., voltage pulses) applied to the first and second word lines 107 and 108 and the bit line 162 result in the effective storage of data at a node 118. For instance, the state of the thyristor can be used to control the voltage level of the storage node, which is particularly useful in memory applications, such as embedded memory and others. For more information regarding data storage and manipulation with a thyristor-based device, such as the device 100, and in particular for controlling current in a thyristor-based device with a capacitively coupled control port, reference may be made to U.S. Pat. No. 6,229,161 (Nemati, et al.), which is fully incorporated herein by reference.

Figure 1B:
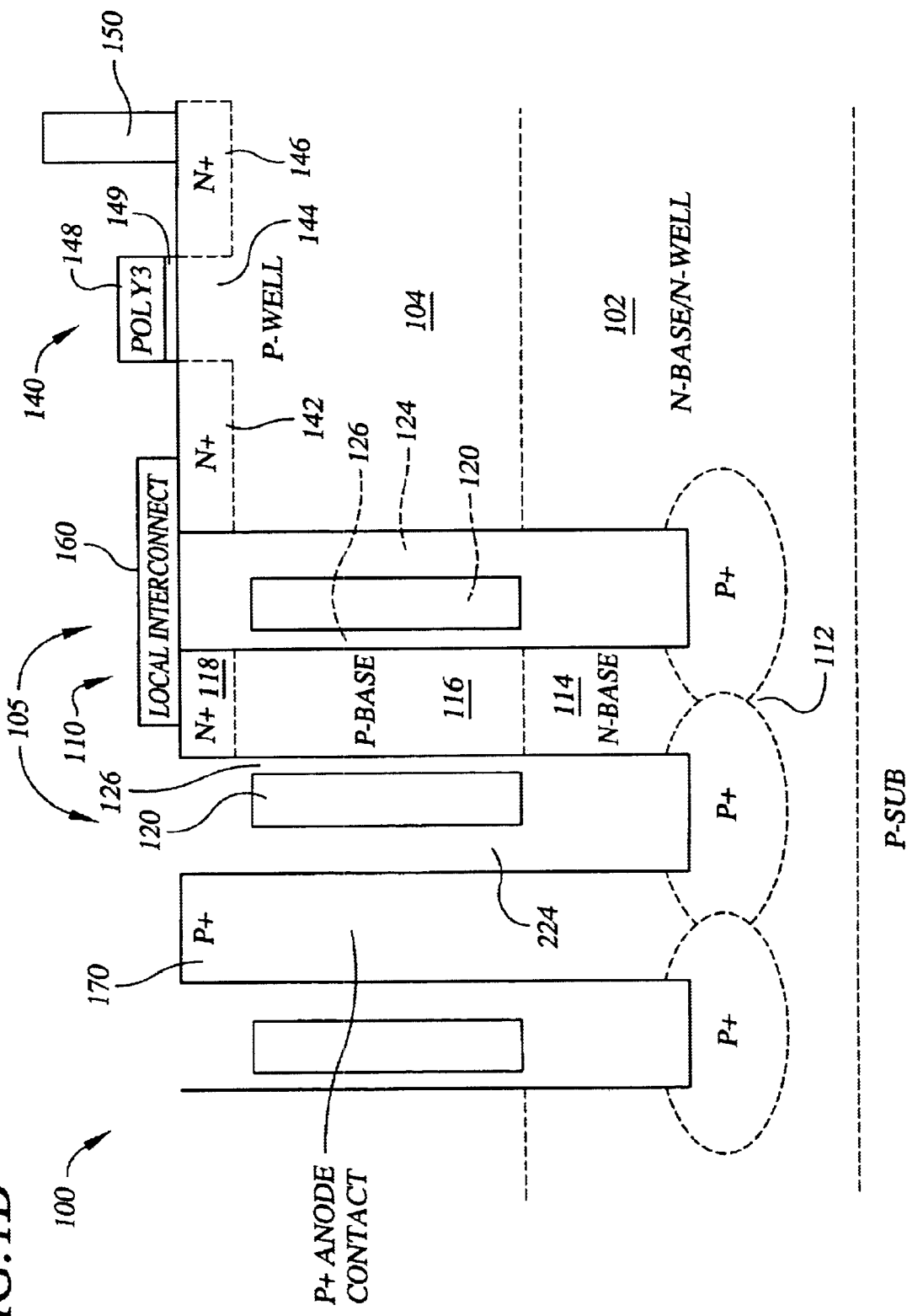
FIG. 1B is a cross-sectional view of a thyristor-based device adapted to inhibit parasitic current, according to an example embodiment of the present invention.

FIG. 1B is a thyristor-based semiconductor device 100 adapted for inhibiting parasitic current leakage, such as that shown in FIG. 1A, according to another example embodiment of the present invention. The semiconductor device includes a first P-doped substrate region 104 (e.g., a P-well region) and a second N-doped substrate region 102 (e.g., an N-well region). A trench 105 extends through the first substrate region, into the second substrate region and around a thyristor body region 110. A portion of the trench includes insulative material, such as oxide, having a thicker portion 124 and a thinner portion 126 near a control port 120. In one implementation, the thinner portion 126 is formed in a portion of the trench where the thicker portion 124 has been removed (e.g., by selective etching). A thyristor body having a P+ emitter region 112, N base region 114, P base region 116 and N+ emitter region 118 is adjacent to the trench and, together with the control port 120, forms a thyristor. The control port 120 has a surface portion thereof facing the P base region 116, is adapted for capacitive coupling to the P base region via the thinner insulator portion 126 and is electrically insulated from the P well region 104 by the thicker insulator portion 124. In one particular implementation, the control port 120 is recessed below the level of the emitter region 118 and the source/drain region 142 of the pass gate, which inhibits the insulator portion 126 from being damaged by the formation of the upper emitter and/or source/drain regions.

A P+ anode sinker contact 170 extends into the second substrate region 102 and makes electrical contact with the P+ emitter region 112. The sinker is useful, for example, to make contact to the P+ emitter region easier for applications including electrically coupling the P+ anode sinker to a reference voltage line. In addition, the sinker may be implemented using one or more of a variety of conductive materials, such as metal or doped polysilicon. The use of a doped polysilicon sinker that contacts substrate at or near the bottom of the trench is particularly useful in applications (not shown) where the thyristor body region 110 is formed with the cathode end down, such that the N+ emitter region is at the bottom of the thyristor.

A pass device 140 is electrically coupled in series with the N+ emitter region 118 via a local interconnect 160 and is adapted to control current flow between a bit line 150 and the N+ emitter region 118. The pass device includes N+ source/drain regions 142 and 146 separated by a channel 14 in the first substrate region 104 and a gate electrode adapted to be capacitively coupled to the channel region 144 via a gate dielectric 149. The current flow is controlled using the gate to switch the pass device between a current blocking state and a conducting state.

The arrangement of the control port, the thyristor body region 110 and the insulative material 124 and 126, relative to each other and to other portions of the device, is selected to inhibit the formation of a conductive channel in the P well region 104. This arrangement thus inhibits current leakage, for example, between the N-doped substrate region 102 and the N+ source/drain region 142. Similarly, any conductive channel formation extending from the N+ source/drain region 142 and the P+ emitter region 112 is also inhibited. In one instance, a portion of the P well region 104 that a surface portion of the control port 120 faces undergoes current leakage when voltage pulses are applied to the control port for controlling current flow in the thyristor body region 110. The control of current flow in the thyristor body region 110 is such that voltage pulses applied to the control port 120 do not cause a strong level of current leakage in the P well region 104; such a strong condition would be created, were higher voltages applied to the control port.

The arrangement, as discussed above, of various portions of the device 100 is selected to achieve the inhibition of a conductive channel in one or more of a variety of manners. In one particular implementation, the thickness of insulative material 124 is selected so that it increases a threshold voltage at which the control port would effect the conductive channel in the P well region 104. In this regard, the threshold voltage for forming such a conductive channel is higher than the voltage required to control current flow in the thyristor body region 110. During normal operation of the device 100, this threshold voltage is not reached and, therefore, a conductive channel does not form in the P well region 104. In another particular implementation, the thickness of the insulative material portion 124 is selected to decrease capacitive coupling between the control port 120 and the P+ emitter region 112 and/or between the control port the P+ anode sinker 170.

In another example embodiment, the P-doped substrate 104 has a higher dopant concentration than the P-base region 116. The relatively higher dopant concentration of the P-doped substrate 104 increases the threshold voltage of a parasitic MOSFET that would potentially form on the pass gate side of the device (e.g., between the source/drain region 142 and the N-doped region 102). In one particular implementation, the P-doped substrate 104 is doped having a retrograde profile, wherein the dopant concentration in the pass gate channel region 144 is lower than the doping in a portion of the P-doped substrate 104 that is immediately adjacent to the sidewall of the trench.

Various example embodiments described below in connection with the figures share similar features with each other and with FIG. 1. In each of these figures, certain discussion of similar features that are similarly numbered is omitted for brevity. In addition, for general information regarding thyristor-based devices employing trench isolation, and for specific information regarding implementations that may be applicable for use in connection with one or more example embodiments of the present invention, reference may be made to the above-referenced patent document entitled "Trench Isolation for Thyristor-based Device."

Figure 2:
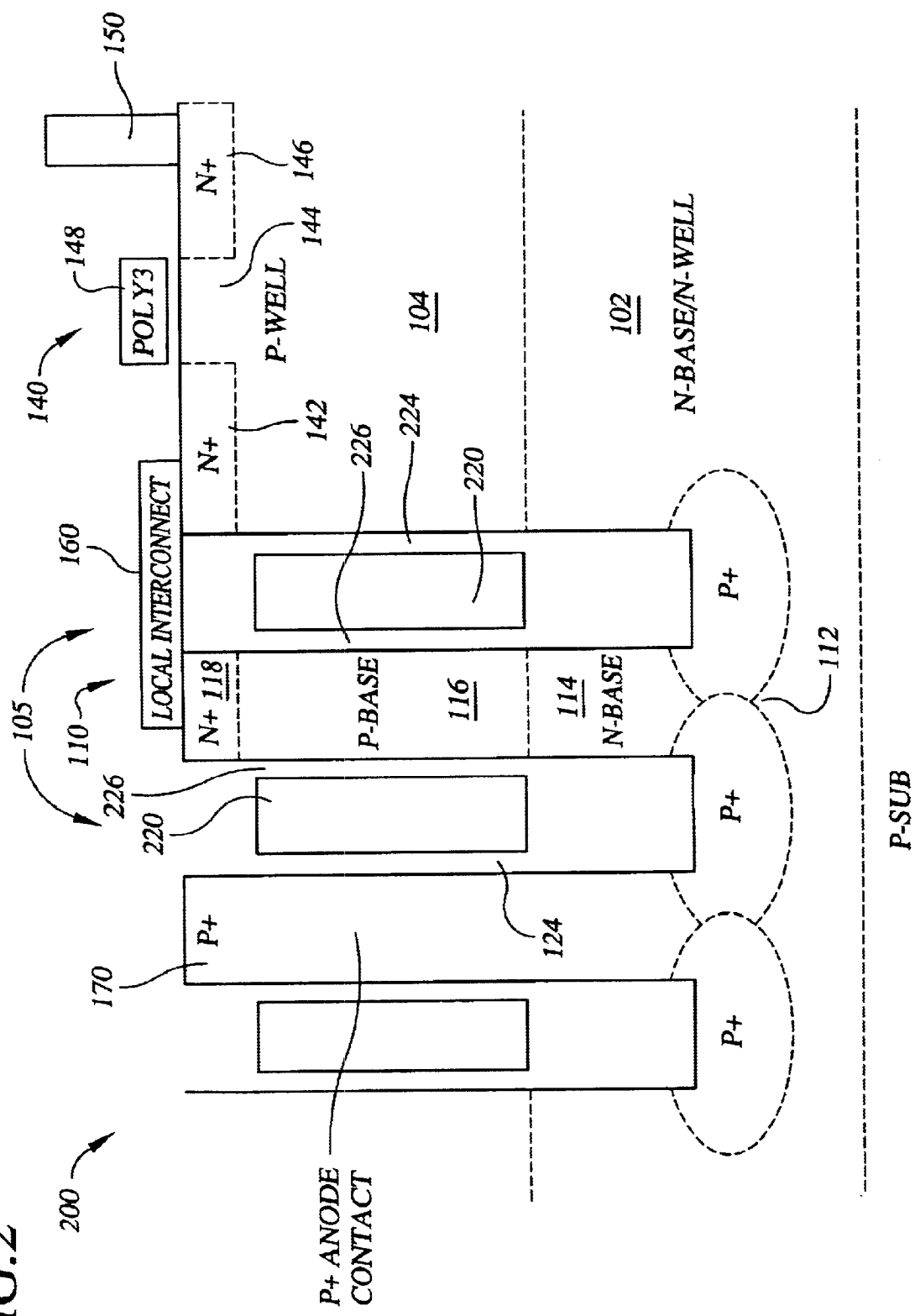
FIG. 2 is a cross-sectional view of a thyristor-based device adapted to inhibit parasitic current, according to another example embodiment of the present invention.

FIG. 2 is a thyristor-based semiconductor device 200 having a substrate and a control port 220 in a trench 105 lined with at least two materials, one of the materials being adapted to inhibit capacitive coupling of the control port to the substrate, according to another example embodiment of the present invention. The device 200 is similar to the device 100 shown in FIG. 1, except wherein the trench 105 is lined with first and second insulative materials 224 and 226, respectively, such as oxide and/or other insulative materials. The first insulative material 224 is adapted to inhibit capacitive coupling between a control port 220 and the first doped substrate region 104. The second insulative material 226 is adapted to facilitate capacitive coupling between a control port 220 and the P base region 116 in a manner that switches the thyristor between a blocking state and a conducting state in response to a voltage being applied to the control port. The portion of the trench below the control port is filled with insulative material and may include one or both of the first and second insulative materials. In one particular implementation (not shown), a conductive filler material is used in a lower portion of the trench 105, such as shown in FIG. 2B of the above-referenced document entitled "Trench Isolation for Thyristor-based Device."

In one particular implementation, the first insulative material 224 has a lower dielectric constant than the second insulative material 226. The lower dielectric constant reduces the capacitive coupling between the control port 220 and the first substrate region, relative to the capacitive coupling that would exist with a similarly-arranged insulative material having the higher dielectric constant of the second insulative material 226. The relatively lower capacitive coupling between the control port 220 and the first doped substrate region 104, as compared to the capacitive coupling between the control port 220 and the P base region 116, facilitates current control in the thyristor while inhibiting channel formation in the first doped substrate region 104.

In another implementation, and referring again to FIG. 2, the first insulative material 224 is adapted to inhibit capacitive coupling of the control port to the first doped substrate region 104 at a threshold voltage applied to the control port for switching the thyristor between current blocking and conducting states. More specifically, the first insulative material is adapted to increase the threshold voltage at which a conductive channel would form in the substrate to a level higher than the threshold voltage that switches the thyristor. In addition, the semiconductor device is adapted to be operated at a voltage applied to the control port that is at least the threshold voltage that switches the thyristor but is below a threshold voltage that forms a conductive channel.

Figure 3:
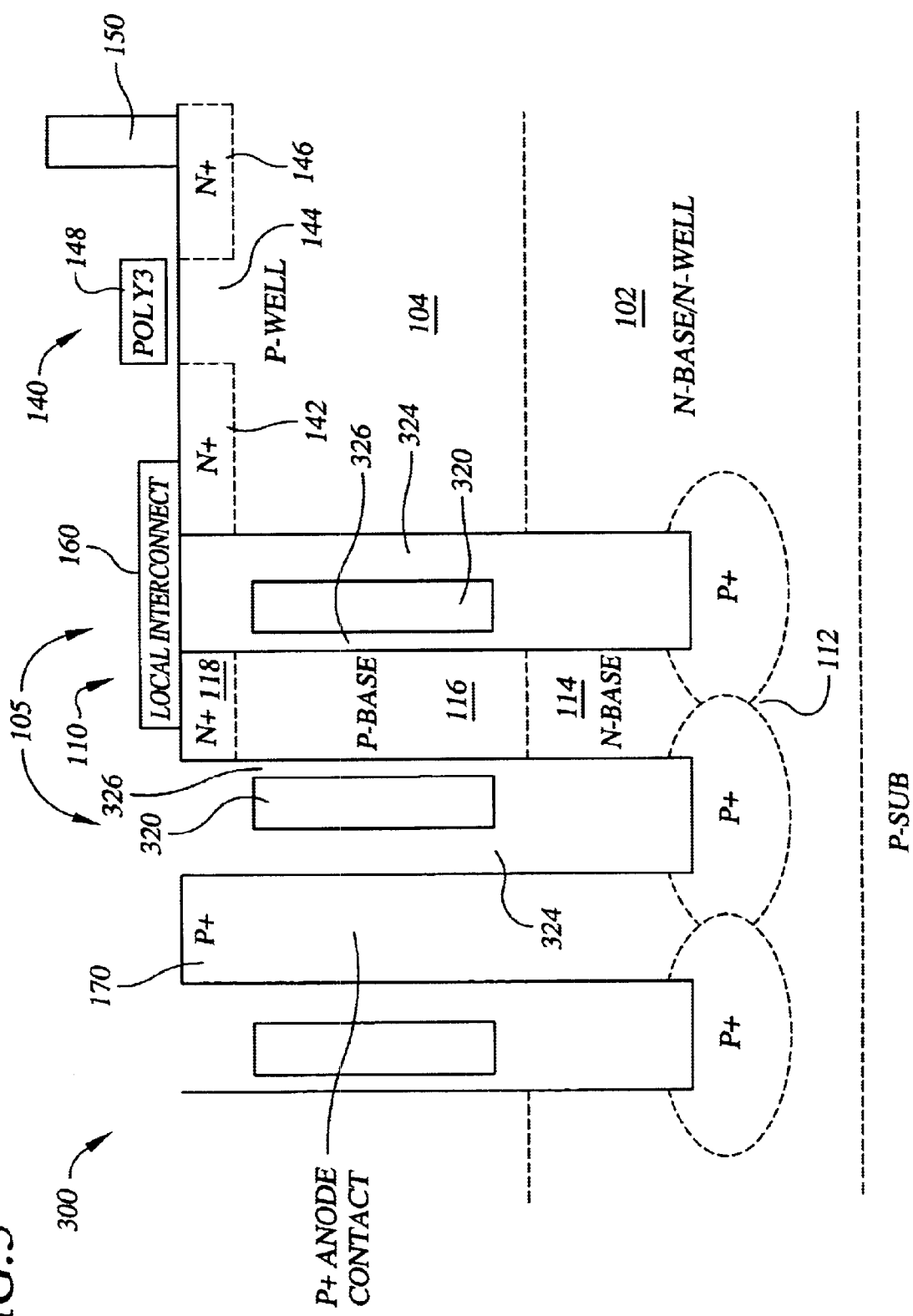
FIG. 3 is a cross-sectional view of a thyristor-based device having a control port that underlaps regions of a thyristor adjacent to a region of the thyristor to which the control port is adapted to be capacitively coupled, according to another example embodiment of the present invention.

FIG. 3 shows a thyristor-based semiconductor device 300, similar to the thyristor-based device 100 of FIG. 1 and wherein the control port 320 underlaps the N+ regions 118 and 142 and the N doped regions 114 and 102, according to another example embodiment of the present invention. The control port 320 is formed in a trench having an insulative material including insulative portion 324 between the control port and the first doped substrate region 104 and insulative portion 326 between the control port and the P base region 326. The control port 320 has a surface portion thereof facing the P gate region 326 and is adapted for capacitively coupling thereto for controlling current in the thyristor body region 110, as discussed above.

As shown, the control port does not extend vertically above or below the P base region 116 and thus does not overlap either of the thyristor regions 114 and 118 contiguously adjacent to the P base region. The underlap is sufficient to inhibit the control port from forming a conducive channel in the first doped substrate region 104 and between the N+ source/drain region 142 and the N well region 102. More specifically, in connection with this example embodiment, it has been discovered that such an underlap can be implemented for raising the threshold voltage required for forming a conductive channel (e.g., create a strong current leakage condition) in the first doped substrate region 104. In one particular implementation, the underlap is arranged to prevent the control port from capacitively coupling to the N+ region 142, and in another implementation is arranged to prevent the control port from capacitively coupling to the second doped substrate region 102.

Figure 4:
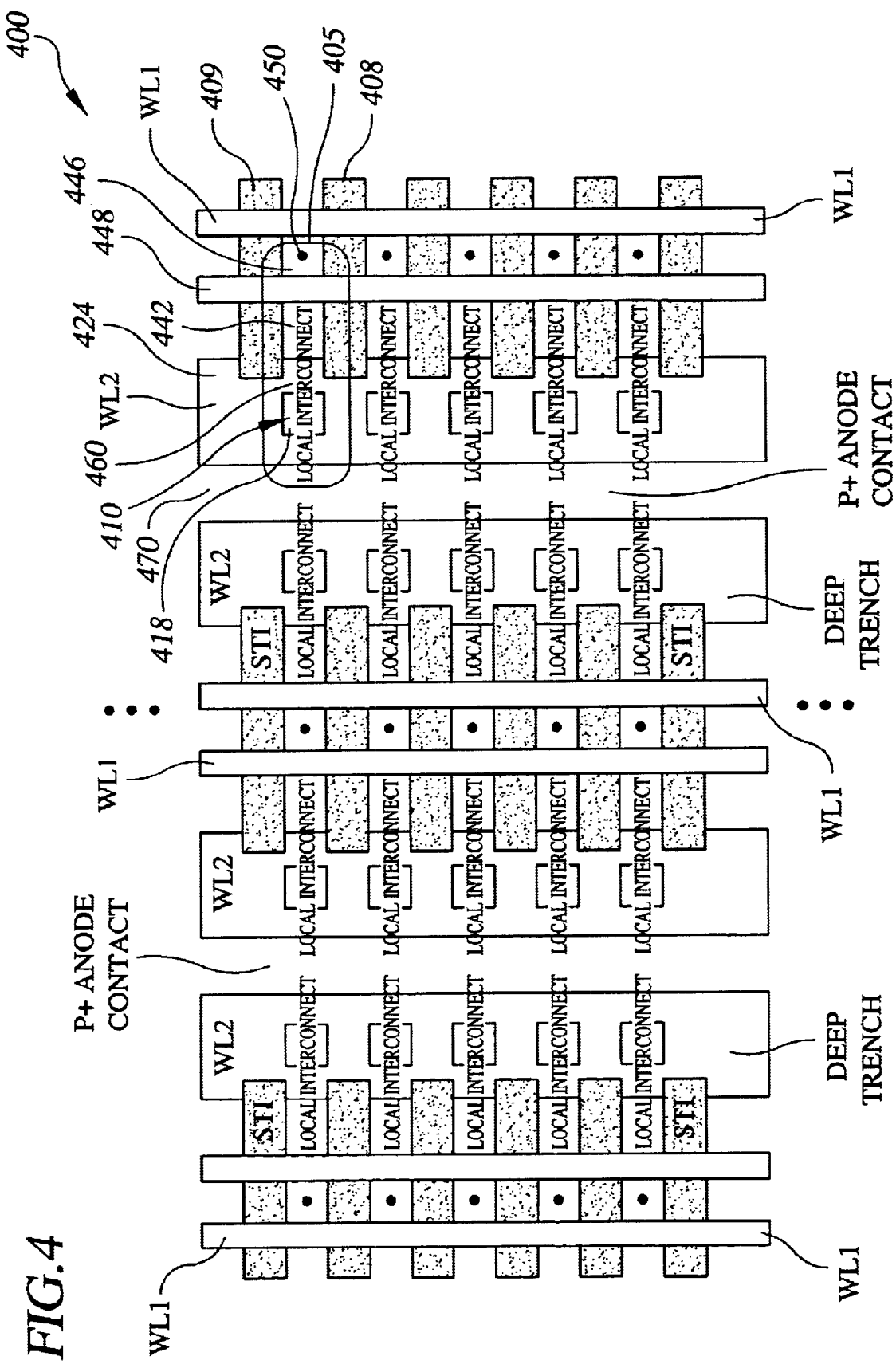
FIG. 4 is a memory array having a plurality of memory cells, one or more of the memory cells including a thyristor-based device adapted to inhibit parasitic current, according to another example embodiment of the present invention.

The thyristor-based devices described in the example embodiments herein are applicable to a variety of implementations. FIG. 4 shows one such implementation, where a thyristor-based device is used in a memory cell 405 in a memory array 400, according to another example embodiment of the present invention. The memory array 400 includes a plurality of memory cells, including cell 405, that are adapted to store information and are separated by shallow trench isolation (STI), such as STI 408 and 409.

Referring to memory cell 405 as an example, a first word line 448 (e.g., similar to word line 107) acts as a gate electrode for a pass device having source/drain regions 442 and 446. The pass device may include, for example, a device similar to pass device 140 of FIG. 1 and makes a conductive channel between the source/drain regions in a first doped substrate. A bit line 450 is coupled to the source/drain region 446, and electrically coupled to an emitter region 418 of a thyristor body 410 when a voltage sufficient to switch the pass device into a conducting state is applied to the first word line 448. The thyristor body 410 may, for example, include the thyristor body region 110 shown in FIG. 1. A second word line 424 is formed around a portion of the thyristor body, in a trench having an insulative liner and is adapted as a control port for switching the thyristor between a blocking state and a conducting state. The second word line and the insulative liner are further configured and arranged such that the second word line does not effect a conductive channel in substrate adjacent to the second word line and between the source/drain region 442 and the thyristor body region 410. A P+ anode contact 470 extends to a bottom emitter region of the thyristor body region 410 (e.g., such as emitter region 112 of FIG. 1).

The first and second word lines 448 and 424, the bit line 450 and the P+ anode contact 470 are adapted to effect read and write functions with the memory cell 410. Referring to FIG. 1 as an example, the N+ emitter region 118 is used to store data, and the stored data is retrieved for memory operations. For example, when the control port 120 is at a voltage that switches the thyristor to a conducting state, the N+ emitter region is electrically coupled to the P+ anode contact 170 (e.g., for applying a reference voltage to the N+ emitter region). When the gate 148 is at a voltage that switches the pass device 140 into a conducting state, the bit line 150 is electrically coupled to the N+ emitter region (e.g., for reading out a voltage level from the N+ emitter region and/or writing to the N+ emitter region).

As an alternative approach, any of the above embodiments can be modified using the approach(es) illustrated and described in concurrently-filed U.S. Provisional Patent Application Ser. No. 60/415,356 (TRAM.037P1), entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; and interchanging P and N regions in the device structures and/or using PMOSFETS rather than NMOSFETS. In addition, for more information regarding thyristor implementations to which the present invention is applicable, reference may be made to U.S. Pat. No. 6,229, 161, referenced above. Such modifications, additions and/or changes do not depart from the true spirit and scope of the present invention that is set forth in the following claims.

What is claimed is:

1. A semiconductor device comprising:
    a substrate including first and second doped portions being doped to the same polarity and separated by a channel region;
    a thyristor including a control port and a body having a region in the substrate, the channel region being susceptible to leakage current passing between the first and second doped portions in response to a voltage pulse applied to the control port for controlling current flow in the thyristor body region in the substrate; and
    wherein the thyristor body, the control port and the first and second doped portions are configured and arranged for inhibiting parasitic current leakage between the first and second doped portions via the channel region when the voltage pulse is applied to the control port.

2. The semiconductor device of claim 1, wherein the control port faces a surface region of the channel region and wherein the thyristor body, the control port and the first and second doped portions are configured and arranged for inhibiting a latch-up condition.

3. The semiconductor device of claim 1, wherein the control port faces a surface region of the channel region and wherein the thyristor body, the control port and the first and second doped regions are configured and arranged for inhibiting the conduction band edge of electrons in the surface region from reaching the Fermi level.

4. The semiconductor device of claim 1, wherein the thyristor includes a body region in the substrate that is adjacent to the second doped portion and wherein the thyristor body, the control port and the first and second doped portions are configured and arranged for inhibiting a current path from forming between the first doped portion and the thyristor body region adjacent to the second doped portion.

5. The semiconductor device of claim 1, wherein the control port is adapted for causing an outflow of minority carriers from the base region in response to the voltage pulse being applied thereto.

6. A semiconductor device comprising:
a substrate including first and second contiguously adjacent regions doped to opposite polarities;
a thyristor including a body and a control port, the body including base and emitter regions in the substrate, the control port having a first surface portion facing the base region and a second surface portion facing the first doped substrate region and adapted for capacitively coupling to the base region for controlling current flow in the thyristor body;
a doped circuit region adjacent to the control port, immediately adjacent to the first substrate region, wherein the doped circuit region and the second doped substrate region are doped to the same polarity; and
wherein the first doped substrate region is susceptible to leakage current passing between the first and second doped portions in response to a voltage pulse being applied to the control port for controlling current flow in the thyristor, and wherein parasitic current leakage between the doped circuit region and the second doped substrate region, via the first doped substrate region, is inhibited when the voltage pulse is applied to the control port for controlling current flow in the thyristor body.

7. The semiconductor device of claim 6, further comprising a current pass device including the doped circuit region and coupled in series with the thyristor body via the doped circuit region, the current pass device employing the doped circuit region as a source/drain region and being configured and arranged for controlling the passing of current between the thyristor and a circuit node.

8. The semiconductor device of claim 7, wherein the thyristor body, the control port and the current pass device are configured and arranged to inhibit the parasitic current leakage.

9. The semiconductor device of claim 8, wherein the emitter region is contiguously adjacent to the second doped substrate region and wherein the thyristor body, the control port and the current pass device are configured and arranged to inhibit the formation of a current channel between the doped circuit region and the emitter region, via the first and second doped substrate regions, when voltage pulses are applied to the control port for controlling current flow in the thyristor body.

10. The semiconductor device of claim 8, wherein the thyristor body, the control port and the current pass device are configured and arranged to inhibit current leakage in the first substrate region when the voltage pulse is applied to the control port for controlling current flow in the thyristor.

11. The semiconductor device of claim 8, wherein the parasitic current leakage is inhibited by the configuration and arrangement of the control port relative to at least one of: the first doped substrate region, the doped circuit region and the second doped substrate region.

12. The semiconductor device of claim 8, wherein the first doped substrate region is susceptible to leakage current passing between the doped circuit region and the second doped substrate region in response to a voltage not less than a first threshold voltage being applied to the control port, wherein the control port is adapted to switch the thyristor body between a current blocking state and a current passing state in response to a voltage pulse applied to the control port that is less than the first threshold voltage.

13. The semiconductor device of claim 12, wherein the control port, thyristor body and pass device are configured and arranged as part of a memory cell.

14. The semiconductor device of claim 8, wherein the control port does not capacitively couple to the doped circuit region when the voltage pulse is applied to the control port for controlling current in the thyristor.

15. The semiconductor device of claim 8, wherein the control port does not capacitively couple to the second doped substrate region when the voltage pulse is applied to the control port for controlling current in the thyristor.

16. The semiconductor device of claim 8, further comprising a trench having sidewalls lined with an insulative material, wherein the control port is in the lined trench, the control port being adapted for capacitively coupling to the base region via the insulative material and wherein the insulative material is adapted to inhibit capacitive coupling between the control port and the first doped substrate region.

17. The semiconductor device of claim 16, wherein the insulative material includes a thicker lining on a sidewall of the trench between the second surface portion of the control port and the first doped substrate region and a relatively thinner lining between the first surface portion of the control port and the base region.

18. The semiconductor device of claim 16, wherein the insulative material includes a first material on a sidewall of the trench between the first surface portion of the control port and the base region and a second material on a sidewall of the trench between the second surface portion of the control port and the first doped substrate region, wherein the first insulative material effects a higher capacitive coupling between the control port and the base region, relative to capacitive coupling between the control port and portions of the semiconductor device facing the second surface portion of the control port.

19. The semiconductor device of claim 18, wherein the first material has a higher dielectric constant than the second material.

20. The semiconductor device of claim 16, wherein the insulative material on a sidewall of the trench between the second surface portion of the control port and the first doped substrate region increases the threshold voltage required to form a conductive channel in the first doped substrate region.

21. The semiconductor device of claim 16, wherein the insulative material is adapted to inhibit capacitive coupling between the control port and an emitter portion of the thyristor.

22. The semiconductor device of claim 21, wherein the thyristor includes a plurality of vertically-arranged regions in the substrate with the emitter region being at the bottom thereof, further comprising a conductive contact extending from an upper surface of the substrate to the emitter and adjacent to the lined trench, wherein the lined trench is adapted to inhibit capacitive coupling between the control port and the conductive contact.

23. The semiconductor device of claim 8, wherein the base region is disposed vertically over the emitter region and wherein the control port underlaps the emitter region.

24. The semiconductor device of claim 8, wherein the thyristor body further includes a second base region disposed vertically over said base region in the substrate and wherein the control port underlaps the second base region.

25. The semiconductor device of claim 8, wherein the first doped substrate region is doped to a higher dopant concentration than the base region.

26. The semiconductor device of claim 25, wherein the first doped substrate region is doped to a concentration that is sufficiently high to increase the threshold voltage required to effect the parasitic current leakage such that the control port controls current flow in the thyristor via voltage pulses that are below the threshold voltage.

27. The semiconductor device of claim 25, wherein the first doped substrate region is doped to a concentration that is sufficiently high to reduce the gain of a parasitic thyristor that includes the control port, the doped circuit region, the first doped substrate region, the second doped substrate region and the emitter region of the thyristor body.

28. The semiconductor device of claim 25, wherein the first doped substrate region is doped with a retrograde profile such that the dopant concentration of a portion of the first doped substrate region that is immediately adjacent to the doped circuit region is less than the dopant concentration of a portion of the first doped substrate region not immediately adjacent to the doped circuit region.

29. A memory cell comprising the semiconductor device of claim 8, wherein the emitter region is coupled to a reference voltage, wherein the thyristor has opposite end portions, a first end portion including said emitter region in the substrate and a second end portion including a second emitter region, wherein the current pass device is coupled between a bit line and the second emitter region and adapted for reading out a state of the second emitter region to the bit line.

30. A thyristor-based semiconductor device having a substrate including first and second adjacent doped substrate regions having opposite doping, the device comprising: a thyristor device comprising:
   a first base region electrically coupled to a first emitter region, the first base region and first emitter region forming a first end portion of the thyristor device;
   a second base region electrically coupled to a second emitter region, the second emitter region being in the second doped substrate region, the second base region and the second emitter region forming a second end portion of the thyristor device, the first and second base regions being electrically coupled to one another; and
a control port in a lined trench and adapted for capacitively coupling to the first base region for controlling current flow in the thyristor device in response to a voltage pulse being applied to the control port, the portion of the lined trench including the control port being contiguously adjacent to the first doped substrate region;
a pass device coupled in series with the thyristor via the first emitter region and comprising:
   first and second source/drain regions in the first doped substrate region, the first source/drain region being electrically coupled to the first emitter region and adjacent to the portion of the lined trench including the control port;
   a gate electrode over a channel in the first doped substrate region between the first and second source/drain regions and adapted for capacitively coupling to the channel via a gate dielectric for forming a conductive channel between the first and second source/drain regions in response to a voltage being applied to the gate electrode; and
wherein the first doped substrate region is susceptible to leakage current passing between the first and second doped regions in response to said voltage pulse being applied to the control port for controlling current flow in the thyristor, and wherein the configuration and arrangement of the control port in the lined trench relative to the first source/drain region and the first and second doped substrate regions is adapted to inhibit the leakage current in response to said voltage pulse being applied to the control port.

* * * * *

UNITED STATES PATENT AND TRADEMARK OFFICE
CERTIFICATE OF CORRECTION

PATENT NO. : 6,686,612 B1
DATED : February 3, 2004
INVENTOR(S) : Horch et al.

It is certified that error appears in the above-identified patent and that said Letters Patent is hereby corrected as shown below:

Drawings,
Figure 1B: "224" should read -- 124 --.
Figure 2: "124" should read -- 224 --.

Signed and Sealed this

Ninth Day of August, 2005

JON W. DUDAS
*Director of the United States Patent and Trademark Office*